(12) United States Patent
Lee et al.

(10) Patent No.: US 7,348,633 B2
(45) Date of Patent: Mar. 25, 2008

(54) HYBRID CRYSTALLOGRAPHIC SURFACE ORIENTATION SUBSTRATE HAVING ONE OR MORE SOI REGIONS AND/OR BULK SEMICONDUCTOR REGIONS

(75) Inventors: Junedong Lee, Hopewell Junction, NY (US); Devendra K. Sadana, Pleasantville, NY (US); Dominic J. Schepis, Wappingers Falls, NY (US); Ghavam G. Shahidi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 147 days.

(21) Appl. No.: 11/164,345

(22) Filed: Nov. 18, 2005

(65) Prior Publication Data

US 2007/0122634 A1    May 31, 2007

(51) Int. Cl.
*H01L 27/01* (2006.01)
*H01L 27/12* (2006.01)
(52) U.S. Cl. ..................................... 257/347; 257/350
(58) Field of Classification Search ........ 257/347–354, 257/627, 628, E21.32, E21.564, E27.112; 438/149, 479, 517
See application file for complete search history.

(56) References Cited

U.S. PATENT DOCUMENTS 6,320,228 B1 * 11/2001 Yu .............................. 257/350

| | | | |
|---|---|---|---|
| 6,911,383 B2 | 6/2005 | Doris et al. | |
| 7,061,054 B2 * | 6/2006 | Tomiye et al. | 257/368 |
| 7,208,815 B2 * | 4/2007 | Chen et al. | 257/627 |
| 2004/0256700 A1 | 12/2004 | Doris et al. | |

OTHER PUBLICATIONS

U.S. Appl. No. 10/725,850 Title: Planar Substrate With Selected Semiconductor Crystal Orientations Formed by Localized Amorphization and Recrystallization of Stacked Template Layers filed: Dec. 2, 2003 DeSouza, et al.
U.S. Appl. No. 10/902,557 Title: Dual Simox Hybrid Orientation Technology (Hot) Substrates filed: Jul. 29, 2004 Saenger, et al.

* cited by examiner

*Primary Examiner*—Hung Vu
(74) *Attorney, Agent, or Firm*—Todd M. C. Li; Hoffman, Warnick & D'Alessandro LLC

(57) ABSTRACT

A substrate for a semiconductor device is disclosed including, in one embodiment, a plurality of semiconductor-on-insulator (SOI) wafers bonded to one another in a single stack. A distal end of the stack includes a first SOI region with a first semiconductor layer having a thickness and a first surface orientation. A surface of the single stack may further include a non-SOI region and/or at least one second SOI region. The non-SOI region may include bulk silicon that extends through all of the insulator layers of the single stack and has a thickness different than that of the first silicon layer. Each second SOI region has a second semiconductor layer having a thickness different than that of the first semiconductor layer and/or a different surface orientation than the first surface orientation. The substrate thus allows formation of different devices on optimal substrate regions that may include different surface orientations and/or different thicknesses and/or different bulk or SOI structures.

15 Claims, 4 Drawing Sheets

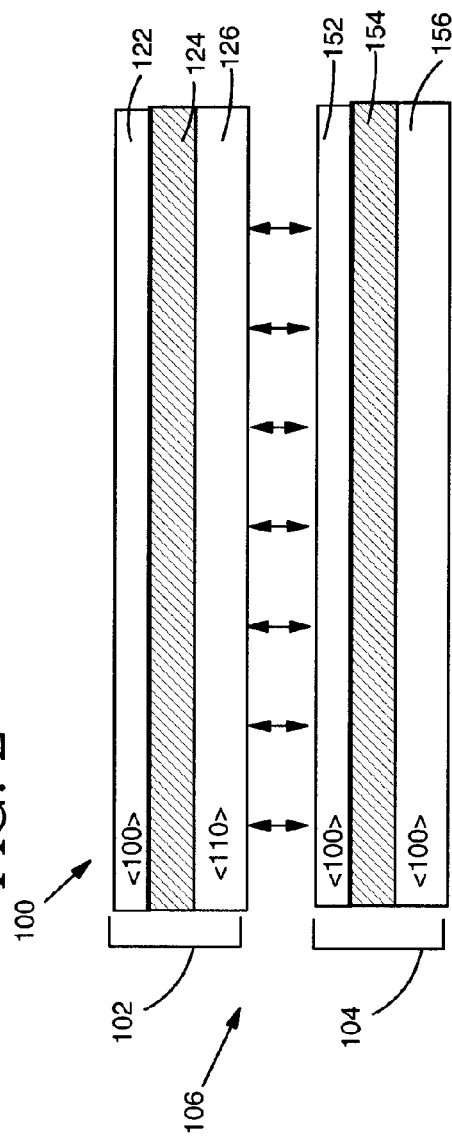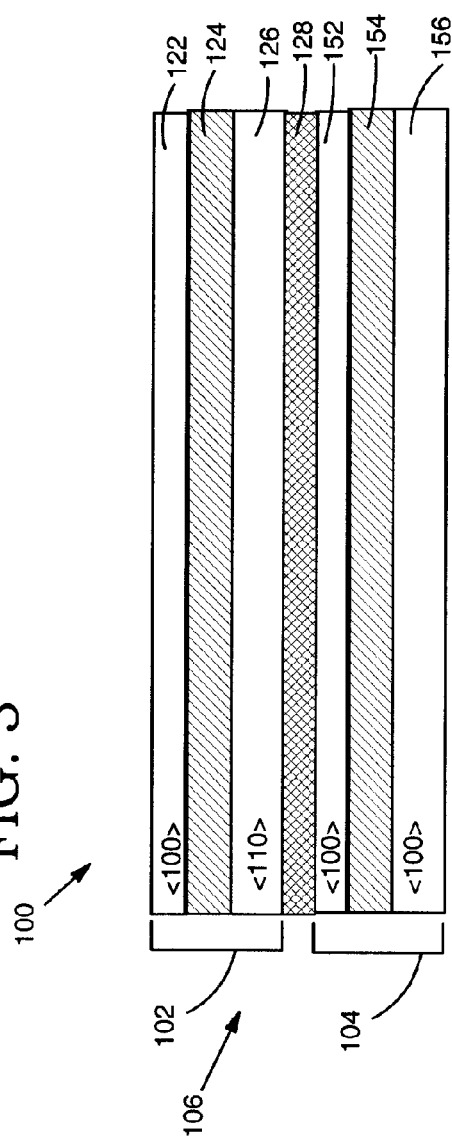

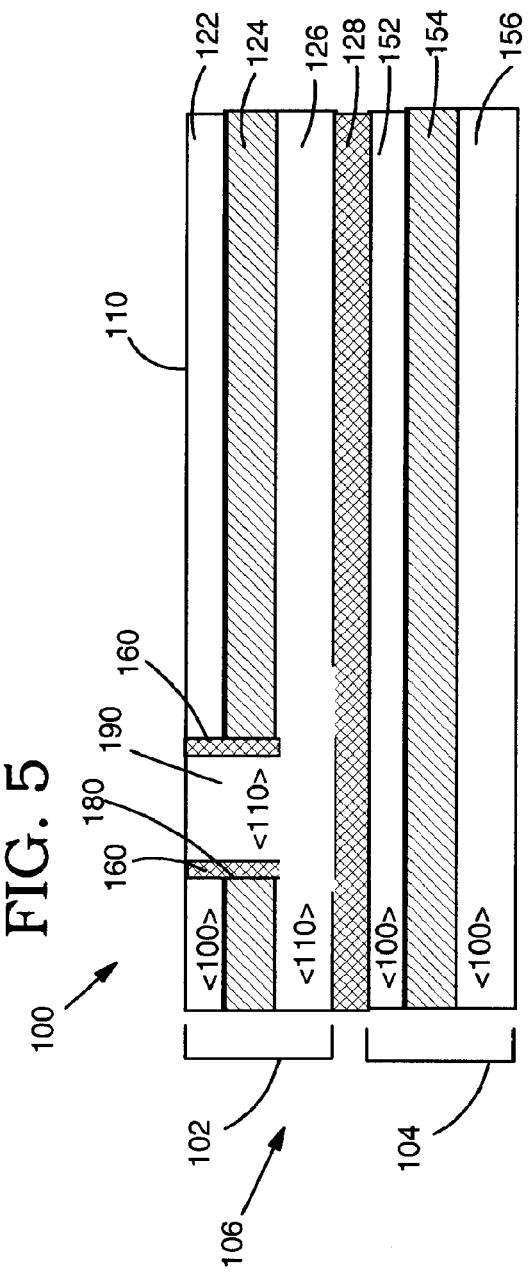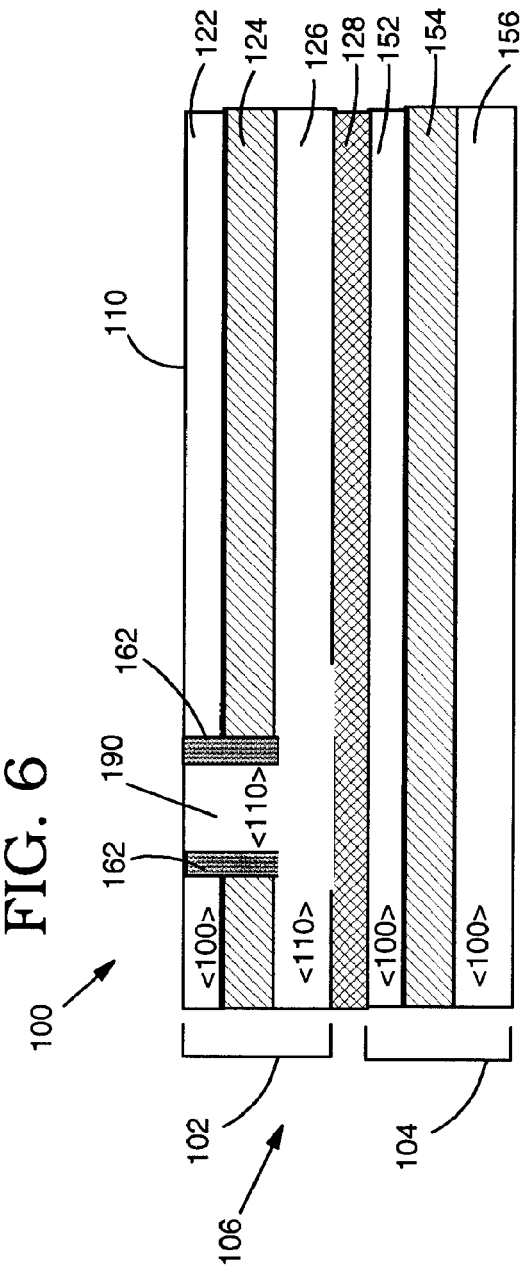

HYBRID CRYSTALLOGRAPHIC SURFACE ORIENTATION SUBSTRATE HAVING ONE OR MORE SOI REGIONS AND/OR BULK SEMICONDUCTOR REGIONS

BACKGROUND OF THE INVENTION

1. Technical Field

The invention relates generally to semiconductor devices, and more particularly, to a substrate having hybrid crystallographic surface orientations in one or more semiconductor-on-insulator (SOI) regions and/or non-SOI regions for supporting different semiconductor devices.

2. Background Art

Performance improvement of semiconductor devices is a never-ending endeavor for manufacturers of those devices. One challenge currently faced by the semiconductor industry is implementing different semiconductor devices, e.g., memory and logic devices, on a single chip while maintaining process simplicity and transistor performance. These devices are referred to as "system-on-chips" (SoC) because the electronics for a complete, working product are contained on a single chip. One approach that is currently employed to improve performance of a SoC is to fabricate the different types of semiconductor devices on silicon substrates having optimal surface orientations. As used herein, "surface orientation" refers to the crystallographic structure or periodic arrangement of silicon atoms on the surface of a wafer. Different surface orientations are optimal for different semiconductor devices. For example, an n-type field effect transistor (nFET) can be optimized by being generated on silicon having a <100> surface orientation, while a p-type FET (pFET) can be optimized by being generated on silicon having a <110> surface orientation. In addition, memory devices and nFETs are typically optimized when generated on semiconductor-on-insulator (SOI) substrates, while pFETs are typically optimized when generated on bulk silicon substrates.

One approach to providing these substrates includes bonding two substrates having different surface orientations to one another, with an insulative silicon dioxide (oxide) layer in between to form an SOI substrate. However, there is a need in the industry for both SOI and non-SOI areas on a single substrate for specific applications. These applications may include, for example, power devices or devices where a thick silicon substrate allows for desired strain from features such as embedded silicon germanium (SiGe) or the like. It also may be desirable to have more than one thickness of silicon over the buried oxide.

In view of the foregoing, there is a need in the art for a substrate having different surface orientations and different structure, e.g., SOI and non-SOI regions.

SUMMARY OF THE INVENTION

A substrate for a semiconductor device is disclosed including, in one embodiment, a plurality of semiconductor-on-insulator (SOI) wafers bonded to one another in a single stack. A distal end of the stack includes a first SOI region with a first semiconductor layer having a thickness and a first surface orientation. A surface of the single stack may further include a non-SOI region and/or at least one second SOI region. The non-SOI region may include bulk silicon that extends through all of the insulator layers of the single stack and has a thickness different than that of the first silicon layer. Each second SOI region has a second semiconductor layer having a thickness different than that of the first semiconductor layer and/or a different surface orientation than the first surface orientation. The substrate thus allows formation of different devices on optimal substrate regions that may include different surface orientations and/or different thicknesses and/or different bulk or SOI structures.

A first aspect of the invention provides a substrate for a semiconductor device, the substrate comprising: a stack including: a first semiconductor-on-insulator (SOI) wafer having a first semiconductor layer having a first surface orientation, a second semiconductor layer having a second surface orientation and a first insulator layer therebetween, at least one second semiconductor-on-insulator (SOI) wafer having a third semiconductor layer having a third surface orientation, a fourth semiconductor layer having a fourth surface orientation and a second insulator layer therebetween, and an oxidized insulator layer between the first SOI wafer and one of the at least one second SOI wafer; and a distal end of the stack including a first SOI region of the first SOI wafer including the first semiconductor layer, and at least one second region including one of the following: a bulk semiconductor region extending through all insulator layers of the stack, the bulk region having a different thickness than a thickness of the first semiconductor layer of the first SOI region, and a second SOI region having at least one of a different semiconductor thickness than a thickness of the first semiconductor layer and a different surface orientation than the first semiconductor layer, wherein at least one of the first, second, third and fourth surface orientations is different than the other surface orientations.

A second aspect of the invention provides a substrate for a semiconductor device, the substrate comprising: a plurality of semiconductor-on-insulator (SOI) wafers bonded to one another in a single stack, wherein a distal end of the single stack includes a first SOI region with a first semiconductor layer having a thickness and a first surface orientation, and wherein a surface of the single stack includes at least one of the following: a non-SOI region extending through all of the insulator layers of the single stack, the non-SOI region having a thickness different than the thickness of the first semiconductor layer, and at least one second SOI region having a second semiconductor layer having at least one of the following: a thickness different than the thickness of the first semiconductor layer and a different surface orientation than the first surface orientation.

A third aspect of the invention provides a method of forming a semiconductor substrate, the method comprising the steps of: providing a first semiconductor-on-insulator (SOI) wafer; bonding a second SOI wafer to the first SOI wafer; forming an opening through a distal semiconductor surface of the bonded wafers, the opening extending to expose one of the other semiconductor layers of the SOI wafers; forming an isolation in the opening; and re-growing a semiconductor material in the opening, the semiconductor material having the same surface orientation as the exposed semiconductor layer.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIG. 2 shows two SOI wafers.

FIG. 3 shows the two SOI wafers of FIG. 1 bonded together into a stack.

FIGS. 4-6 show steps of one embodiment of a method according to the invention.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
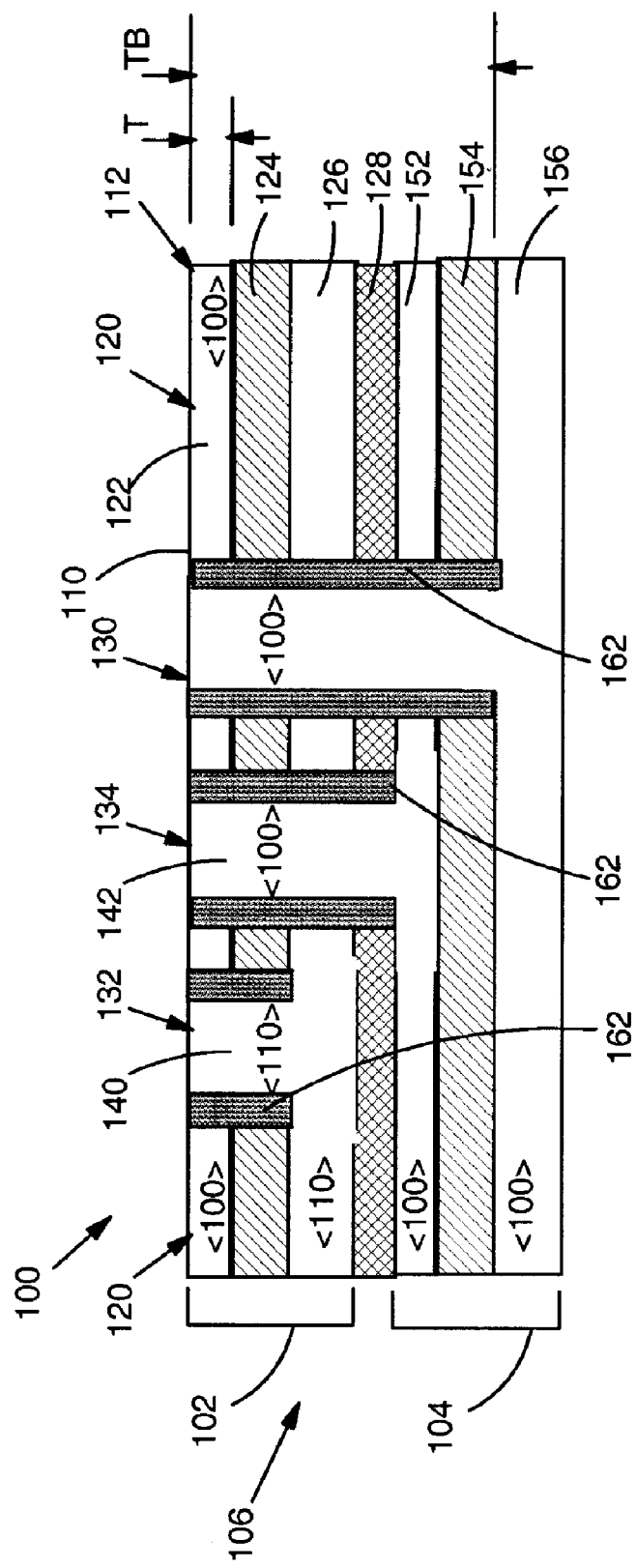
FIG. 1 shows one embodiment of a substrate according to the invention.

Referring to FIG. 1, one embodiment of a substrate 100 for semiconductor devices according to the invention is illustrated. Substrate 100 includes a plurality of semiconductor-on-insulator (SOI) wafers 102, 104 bonded to one another in a single stack 106. While only two SOI wafers 102, 104 are illustrated, as will be apparent to one with skill in the art, the teachings of the invention are not limited to just two SOI wafers. Each SOI wafer 102, 104 includes a semiconductor layer 122, 152 (typically some form of silicon, silicon germanium or germanium), an insulator layer 124, 154 (e.g., of silicon dioxide ($SiO_2$)), and a semiconductor layer (substrate) 126, 156, e.g., of bulk silicon. First SOI wafer 102 includes a first semiconductor layer 122 having a first surface orientation, a second semiconductor layer 126 having a second surface orientation and a first insulator layer 124 therebetween. Similarly, each second SOI wafer 104 includes a third semiconductor layer 152 having a third surface orientation, a fourth semiconductor layer 156 having a fourth surface orientation and a second insulator layer 154 therebetween. At least one semiconductor layer has a different surface orientation than the other layers. For example, as shown, semiconductor layer 126 has a different surface orientation. Each SOI wafer 102, 104 may be provided as a conventional SOI wafer, a separation by implantation of oxygen (SIMOX) wafer or a bonded wafer. At least one semiconductor layer 122, 152, 126, 156 of stack 106 may include silicon, germanium, silicon germanium, strained silicon on silicon germanium or strained silicon.

First and second SOI wafers 102, 104 are bonded together in any now known or later developed fashion. In one embodiment, bonding includes forming an oxidized insulator layer 128 on second SOI wafer 104, and joining first SOI wafer 102. Each SOI wafer 102, 104 in stack 106 may be similarly bonded to an adjacent SOI wafer by an oxidized insulator layer. In the illustrated embodiment, stack 106 includes two SOI wafers 102, 104 so as to include three insulator layers 124, 154, 128 in the stack.

Substrate 100 also includes a surface 110 of a distal end 112 of single stack 106 that includes a first SOI region 120 with a first semiconductor layer 122 having a thickness (T) and a first surface orientation. First SOI region 120 is formed as part of first SOI wafer 102. As shown, the first surface orientation is <100>. However, any surface orientation typically used for optimizing a particular device may be used, e.g., <100>, <110> or <111>. For example, nFETs prefer a <100> surface orientation for the highest mobility, while pFETs show the corresponding mobility increase with a <110> surface orientation. In any event, as mentioned above, according to one embodiment of the invention, at least one of the surface orientations of silicon layers 122, 126, 154, 156 is different than the other surface orientations.

Distal end 112 may further include a non-SOI region 130 and/or at least one second SOI region 132, 134. Each region 130, 132, 134 may have a different silicon thickness than first SOI region 120. In addition, each region 130, 132, 134 may also have a surface orientation that is the same as first SOI region 120 or different than first SOI region 120, depending on the surface orientation of the silicon layer from which the region 130, 132, 134 is epitaxially grown. As a result, substrate 100 may provide a variety of different surface orientations and/or semiconductor thicknesses and/or structure, e.g., bulk or SOI, in a single stack 106. Substrate 100, therefore, allows for formation of a variety of different devices on a single substrate 100.

Turning to the details of the illustrative regions, in one embodiment, non-SOI region 130 extends through all of insulator layers 124, 128, 154 of single stack 106 to lowermost semiconductor layer (substrate) 156 and may include bulk silicon. As a result, non-SOI region 130 has a thickness (TB) different than the thickness (T) of first semiconductor layer 122. In addition, as will be described below, since non-SOI region 130 is epitaxially grown from semiconductor layer (substrate) 156, it has the same surface orientation, which may be the same as the first surface orientation, e.g., <100>, or different. As illustrated, the surface orientations are the same, i.e., <100>.

Each second SOI region 132, 134 may have a second semiconductor layer 140, 142, respectively, having at least one of the following: a thickness different than the thickness of first silicon layer 122 and a different surface orientation than the first surface orientation. As illustrated, second SOI region 132 has a <110> surface orientation, while second SOI region 134 has a <100> surface orientation. Each second SOI region 132, 134 has a different thickness than thickness (T) of first semiconductor layer 122. The surface orientations and thickness of second SOI regions 132, 134 can be determined based on from which semiconductor layer the region 132, 134 is epitaxially grown. In one embodiment, as shown, first SOI region 120 has a <100> surface orientation, while second SOI region 132 has a <110> surface orientation, second SOI region 134 has a <100> surface orientation and non-SOI region 130 has a <100> (shown) or a <110> surface orientation. However, if desired, distal end 112 may include three different surface orientations, e.g., first SOI region 120 with a <100> surface orientation, second SOI region 132 with a <110> surface orientation and non-SOI region 130 and/or second SOI region 134 with a <111> surface orientation.

Each region 130, 132, 134 other than first SOI region 120 includes a trench isolation 162, e.g., of silicon dioxide ($SiO_2$).

Turning to FIGS. 2-6, one embodiment of a method of forming semiconductor substrate 100 will now be described. It should be recognized that substrate 100 may be formed by a variety of other methods not herein described, but considered within the scope of the invention. Referring to FIGS. 2 and 3, in first steps, a first SOI wafer 102 is provided, and then bonded to a second SOI wafer 104. As mentioned above, the bonding step may include any now known or later developed method for bonding wafers. In one embodiment, as shown in FIG. 3, the bonding step may include forming an oxidized insulator layer 128 on a surface of second SOI wafer 104 and joining first and second SOI wafers 102, 104 at oxidized insulator layer 128. It should be recognized, however, that various other bonding techniques now known or later developed are also possible, e.g., joining the first and second SOI wafers 102, 104 without an oxide insulating layer 128, which is referred to as silicon-to-silicon bonding.

Figure 4:
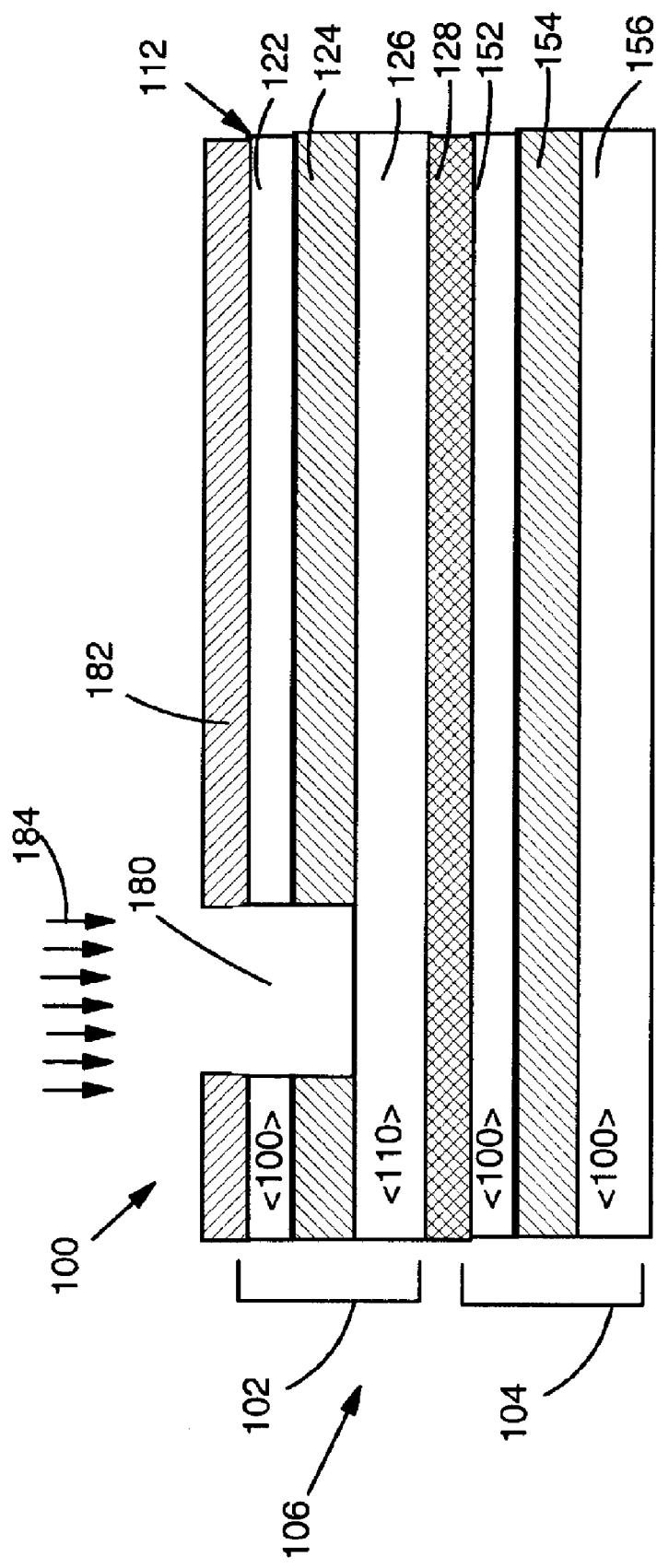

As shown in FIG. 4, a next step includes forming an opening 180 through a distal semiconductor surface, i.e., silicon layer 122 of distal end 112, of the bonded wafers. In one embodiment, opening 180 is formed by depositing a mask 182, patterning mask 182 and etching 184, e.g., reactive ion etching (RIE) using chemistry such as tetrafluoromethane (CF$_4$) or a polymerizing etch, to a selected depth in stack 106. That is, opening 180 extends to expose one of the other semiconductor layers 126, 152, 156 of SOI wafers 102, 104. As illustrated, opening 180 exposes semiconductor layer 126. However, it could be any semiconductor layer. In addition, more than one opening 180 may be formed at any time, if desired. Mask 182 is then removed.

Next, as shown in FIG. 5, an isolation 160 is formed in opening 180 in any conventional manner for isolating the region from surrounding structure during formation. In one embodiment, a first part of this step includes forming a sidewall spacer 160, which may include, for example, silicon dioxide (SiO$_2$) and/or silicon nitride (Si$_3$N$_4$). Sidewall spacers 160 may have a thickness of, for example, 20-200 nm, depending on the needs of the structure. As also shown in FIG. 5, a next step includes re-growing a semiconductor material 190 in opening 180. The growth may be selective or non-selective depending on the masking scheme used. Growth is continued until the semiconductor material 190 reaches surface 110, or may be planarized to meet surface 110 by chemical mechanical polishing (CMP). Semiconductor material 190, e.g., silicon, has the same surface orientation as the exposed semiconductor layer, i.e., as shown, semiconductor layer 126.

As shown in FIG. 6, a second part of the isolation forming step may include replacing each sidewall spacer 160 (FIG. 5) with a trench isolation 162, e.g., silicon dioxide (SiO$_2$) and/or silicon nitride (Si$_3$N$_4$). The isolation step may be provided in other forms than that described, e.g., the isolations may be formed after semiconductor material re-growth. Trench isolations 162 allow for formation of different devices within each region and provide removal of the typically defective epitaxial growth adjoining sidewall spacers 160, i.e., trenches etched for trench isolations 162 are wider than sidewall spacers 160.

It should be recognized that the above-described opening forming, isolation forming and re-growing steps may be repeated such that numerous regions 130, 132, 134 can be formed, as shown in FIG. 1. For example, the method may include the steps of forming another opening to a different semiconductor layer of SOI wafers 102, 104, and repeating the isolation forming and re-growing steps to form, for example, non-SOI region 130 or another second SOI region 134. For non-SOI region 130, opening 180 would extend through all insulator layers 124, 128, 154 of SOI wafers 102, 104 such that the re-grown semiconductor material would include the bulk silicon of layer 156. In any event, substrate 100 could result in at least one re-grown semiconductor material having a surface orientation different than a surface orientation of distal semiconductor layer 122.

Traditional semiconductor processing would continue at this point, allowing the formation of certain devices on non-SOI regions 130 of substrate 100, while other high performance devices could be formed on SOI regions 120, 132, 134 of multiple surface orientations or as part the multiple crystals such as germanium (Ge) or silicon germanium (SiGe). That is, one of semiconductor layers 122, 126, 152, 156 could originally include, for example, SiGe instead of silicon or silicon germanium on insulator instead of silicon-on-insulator. In an alternate embodiment, a SiGe layer could be deposited on a silicon substrate 156 first, such that the dual buried oxide layers 128, 154 could be in SiGe and Si materials simultaneously. This structure would allow for the possible growth of a strained silicon layer over the SiGe layer to provide another combination of layers. It should be recognized that variations of this process can be made to the mask or etching depths to form slightly modified structures, and that these modifications are considered within the scope of the invention.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A substrate for a semiconductor device, the substrate comprising:
   a stack including:
   a first semiconductor-on-insulator (SOI) wafer having a first semiconductor layer having a first surface orientation, a second semiconductor layer having a second surface orientation and a first insulator layer therebetween,
   at least one second semiconductor-on-insulator (SOI) wafer having a third semicoductor layer having a third surface orientation, a fourth semiconductor layer having a fourth surface orientation and a second insulator layer therebetween, and
   an oxidized insulator layer between the first SOI wafer and the at least one second SOI wafer; and
   a distal end of the stack including a first SOI region of the first SOI wafer including the first semiconductor layer, and at least one second region including one of the following:
   bulk semiconductor region extending through all insulator layers of the stack, the bulk region having a different thickness than a thickness of the first semiconductor layer of the first SOI region, and
   a second SOI region having at least one of a different semiconductor thickness than a thickness of the first semiconductor layer and a different surface orientation than the first semiconductor layer,
   wherein at least one of the first, second, third and fourth surface orientations is different than the other surface orientations.

2. The substrate of claim 1, wherein at least one semiconductor layer includes one of the following: silicon, germanium, silicon germanium, strained silicon on silicon germanium and strained silicon.

3. The substrate of claim 1, wherein the surface orientations are selected from the group consisting of: <100>, <110>, and <111>.

4. The substrate of claim 1, wherein each region other than the first SOI region includes a trench isolation isolating the region front surrounding structure.

5. The substrate of claim 4, wherein the trench isolation includes one of the following: silicon dioxide and silicon nitride.

6. The substrate of claim 1, further comprising a silicon germanium layer over the second semiconductor layer.

7. A substrate for a semiconductor device, the substrate comprising:
   a plurality of semiconductor-on-insulator (SOI) wafers bonded to one another in a single stack, wherein a distal end of the single stack includes a first SOI region with a first semiconductor layer having a thickness and a first surface orientation, and wherein a surface of the single slack includes at least one of the following:
a non-SOI region extending through all insulator layers of the single stack, the non-SOI region having a thickness different than the thickness of the first semiconductor layer, and
at least one second SOI region having a second semiconductor layer having at least one of the following: a thickness different than the thickness of the first semiconductor layer and a different surface orientation than the first surface orientation.

8. The substrate of claim 7, wherein the non-SOI region has a surface orientation different than the first surface orientation.

9. The substrate of claim 7, wherein at least one semiconductor layer of the stack includes one of the following: silicon, germanium, silicon germanium, strained silicon on silicon germanium and strained silicon.

10. The substrate of claim 7, wherein each region other than the first SOI region includes a trench isolation isolating the region from surrounding structure.

11. The substrate of claim 7, wherein the non-SOI region includes bulk silicon.

12. The substrate of claim 7, wherein the surface includes the first SOI region having a <100> surface orientation, the second SOI region having a <110> surface orientation and the non-SOI region having one of a <100> surface orientation and a <110> surface orientation.

13. The substrate of claim 7, wherein each SOI wafer in the stack is bonded to an adjacent SOI wafer by an oxidized insulator layer.

14. The substrate of claim 13, wherein the stack includes two SOI wafers so as to include three insulator layers in the stack.

15. The substrate of claim 7, wherein the surface includes three different surface orientations.

* * * * *